US009241425B1

(12) United States Patent
Serjak et al.

(10) Patent No.: US 9,241,425 B1
(45) Date of Patent: Jan. 19, 2016

(54) ANGLED CARD CAGE FOR IMPROVED COOLING AIRFLOW IN FRONT TO BACK AIRFLOW PRODUCTS

(71) Applicants: Alcatel Lucent USA, Inc., Murray Hill, NJ (US); Alcatel-Lucent Canada, Inc., Ottawa (CA)

(72) Inventors: Peter J. Serjak, Stittsville (CA); Joseph D. Griffin, Lake Oswego, OR (US); Stefano De Cecco, Ottawa (CA)

(73) Assignee: Alcatel Lucent, Boulogne-Billancourt (FR)

( * ) Notice: Subject to any disclaimer, the term of this patent is extended or adjusted under 35 U.S.C. 154(b) by 15 days.

(21) Appl. No.: 14/319,619

(22) Filed: Jun. 30, 2014

(51) Int. Cl.
*H05K 7/00* (2006.01)
*H05K 7/20* (2006.01)
(52) U.S. Cl.
CPC ........ *H05K 7/20554* (2013.01); *H05K 7/20145* (2013.01); *H05K 7/20572* (2013.01); *H05K 7/20581* (2013.01)
(58) Field of Classification Search
CPC ........................ H05K 7/20572; H05K 7/20581
See application file for complete search history.

(56) References Cited

U.S. PATENT DOCUMENTS

| | | | |
|---|---|---|---|
| 6,193,339 B1* | 2/2001 | Behl ...................... | G11B 33/02 312/223.2 |
| 7,542,288 B2 | 6/2009 | Lanus | |
| 2003/0214785 A1* | 11/2003 | Perazzo ............ | H05K 7/20581 361/695 |
| 2005/0022967 A1* | 2/2005 | Hall ................... | H05K 7/20572 165/80.2 |
| 2005/0162831 A1* | 7/2005 | Shum ................. | H05K 7/20581 361/695 |
| 2007/0047200 A1* | 3/2007 | Huang ...................... | G06F 1/20 361/695 |
| 2008/0024982 A1* | 1/2008 | Holland ............ | H05K 7/20581 361/695 |
| 2009/0097204 A1* | 4/2009 | Byers ................. | H05K 7/20572 361/695 |
| 2009/0201642 A1* | 8/2009 | Diaz .................. | H05K 7/20581 361/695 |
| 2010/0091458 A1 | 4/2010 | Mosier et al. | |
| 2015/0084491 A1* | 3/2015 | Guering ............ | H05K 7/20572 312/236 |

* cited by examiner

*Primary Examiner* — Hung V Ngo
(74) *Attorney, Agent, or Firm* — Kramer & Amado, P.C.

(57) ABSTRACT

An angled card cage for improved cooling airflow in front to back airflow products is disclosed. The angled card cage for improved cooling airflow includes a card cage having horizontally mounted circuit cards wherein the card cage is oriented at a non-orthogonal yaw angle relative to the front facing of an equipment rack. The angled card cage for improved cooling airflow provides advantages over systems known in the art by reducing pressure head losses incurred by the cooling air stream.

7 Claims, 4 Drawing Sheets

ANGLED CARD CAGE FOR IMPROVED COOLING AIRFLOW IN FRONT TO BACK AIRFLOW PRODUCTS

FIELD OF THE INVENTION

The invention relates to cooling air flow in equipment and is particularly concerned improving cooling performance by minimizing cooling air pressure head loss in rack mounted equipment shelves.

BACKGROUND OF THE INVENTION

It is common in telecommunications systems to rely on card cages that are secured in standardized racking systems. Pre-determined specifications define the height and other dimensions of the enclosures for these card cages so that equipment provided by various manufacturers may be readily used in combination in standard racks. Some example standards for dimensioning include, but are not limited to, AMC, ARINC, ATCA, cPCI, MicroTCA, VME, and VME 64. These standards are defined by various industry standards organizations including ANSI, IEEE, PICMG, VITA, as well as others including military organizations. A the electronics cards that are mounted in the card cages generate heat during their operation, appropriate amounts of cooling airflow are provided to carry the heat away from the operating equipment.

North American data centers and telecommunication companies are increasingly demanding that central office equipment incorporate front to back cooling solutions, wherein cooling air is drawn in from the front of the cabinet and exhausted to the rear. This allows the service provider to set up more manageable HVAC (Heating, Ventilating, and Air Conditioning) environments with cooler (front) maintenance aisles and warmer (rear) wiring aisles.

This requirement causes implementation challenges with smaller sized products and enclosures that are typically designed with horizontal cards using side-to-side cooling. Front to back air cooled systems require significantly more rack height, due to larger cooling intake and exhaust requirements and typically require cards to be installed vertically or limit the thermal load of horizontal cards.

Referring to FIG. 1, there may be seen a typical Central Office Small Box card cage assembly 100 has rack mounting flanges 102 according to the prior art. Circuit cards 104 are mounted within card cage assembly 100. Fans 106 induce cooling air flow to pass through card cage assembly 100 and circuit cards 104, with the cooling air entering on the fan side of card cage assembly 100 and exiting the opposite side.

Referring to FIG. 2, there may be seen an alternate solution according to the prior art, wherein front to back airflow is achieved at the expense of additional vertical rack space. Card cage assembly 200 has been rotated by 90 degrees from the orientation shown in FIG. 1, and again has circuit cards 204 mounted within card cage assembly 200 and fans 206. Large intake baffles 208 are located at the bottom of the card cage assembly 200, and corresponding large exhaust baffles 210 are located at the top of the chassis. Cooling air flow enters at the front of card cage assembly 200 through intake baffles 208, is accelerated by fans 206, and proceeds vertically through card cage assembly 200, passing circuit cards 204 and cooling them thereby. The heated air exits exhaust baffles 210 at the top of the card cage assembly 200 and is directed to the rear of the rack. By way of example, in FIG. 2 the 10.5" tall Small Box card cage assembly 200 in this configuration requires approx. 26.3" of rack height to provide sufficient intake and exhaust openings. In space constrained central offices this additional vertical height requirement is not a preferred arrangement from the operator's perspective.

Referring now to FIGS. 3A and 3B, there may be seen yet another prior art method of routing cooling air through a card cage assembly. FIG. 3A provides an elevation view of this configuration from the front of the equipment rack. Central Office Small Box card cage assembly 300 has rack mounting flanges 302 according to the prior art. Circuit cards 304 are mounted within card cage assembly 300. Fans 306 induce cooling air flow to pass through card cage assembly 300 and circuit cards 304, with the cooling air entering opposite to the fan side of card cage assembly 300 at 308 and exits after passing through the fan assembly 306 at exhaust 310. FIG. 3B is a view of this configuration from the top. Cooling air enters from the front at 308, passes through the equipment cards 304, passes through the fan assembly 306, and exits via the rear exhaust 310. In this configuration cooling air must navigate several sharp turns—as it enters the intake baffles and then turns 90° to flow through the cards 304, and then upon exiting the fan assembly 306 it then turns a further 90° to flow through the rear exhaust 310. These changes in air direction result in pressure head loss, limiting the amount of cooling air that is provided by the system fans.

Therefore, there exists a need to overcome the drawbacks associated with the prior art as discussed above.

SUMMARY OF THE INVENTION

It is an object of the invention to provide a construction which reduces pressure losses in cooling air flows when routed through the front of an equipment assembly to exhaust in the back of the equipment assembly.

According to a first aspect of the invention there is disclosed an electronics enclosure for mounting on an equipment rack having a front and back orientation in use, the electronics enclosure having a first front face oriented in the direction of the front of the equipment rack, the first front face including at least one air inlet; a second back face oriented in the direction of the back of the equipment rack, the second back face including at least one air exhaust; a card cage having a plurality of horizontal card slots vertically offset from one another for receiving a plurality of electric cards, wherein each of the plurality of card slots have respective longitudinal axes that are substantially parallel; the card cage oriented at a non-orthogonal yaw angle with respect to the first front face; a first plenum disposed operatively between the air inlet and the card cage; the first plenum having a cross-section which becomes smaller as the distance increases from the air inlet; a second plenum disposed operatively between the card cage and the air exhaust, the second plenum having a cross-section which becomes larger as the distance decreases towards the air exhaust; and at least one fan operative to force air to flow along an airflow pathway that extends from the air inlet into the first plenum, through the card cage, into the second plenum, and out the air exhaust.

In some embodiments of this aspect of the invention the yaw angle is between 1° and 25°. In some of these embodiments the yaw angle is between approximately 5° and approximately 10°. In others of these embodiments the yaw angle is approximately 8°.

In some embodiments of the invention the at least one fan is disposed between the first plenum and the card cage. In other embodiments of the invention the at least one fan is disposed between the card cage and the second plenum. In yet other embodiments of the invention the at least one fan is disposed between the first plenum and the card cage; and there is at least a second fan disposed between the card cage and the second plenum.

Note: in the following the description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

BRIEF DESCRIPTION OF THE DRAWINGS

The present invention will be further understood from the following detailed description of embodiments of the invention, with reference to the drawings in which like reference numbers are used to represent like elements, and.

DETAILED DESCRIPTION

In the following description, numerous specific details are set forth. However, it is understood that embodiments of the invention may be practiced without these specific details. In other instances, well-known assemblies, structures and techniques have not been shown in detail in order not to obscure the understanding of this description. It will be appreciated, however, by one skilled in the art that the invention may be practiced without such specific details. Those of ordinary skill in the art, with the included descriptions, will be able to implement appropriate functionality without undue experimentation.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such a feature, structure, or characteristic in connection with other embodiments whether or not explicitly described.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, cooperate or interact with each other. "Connected" is used to indicate the establishment of communication between two or more elements that are coupled with each other.

In general in the description of the figures, like reference numbers are used to represent like elements.

Figure 1:
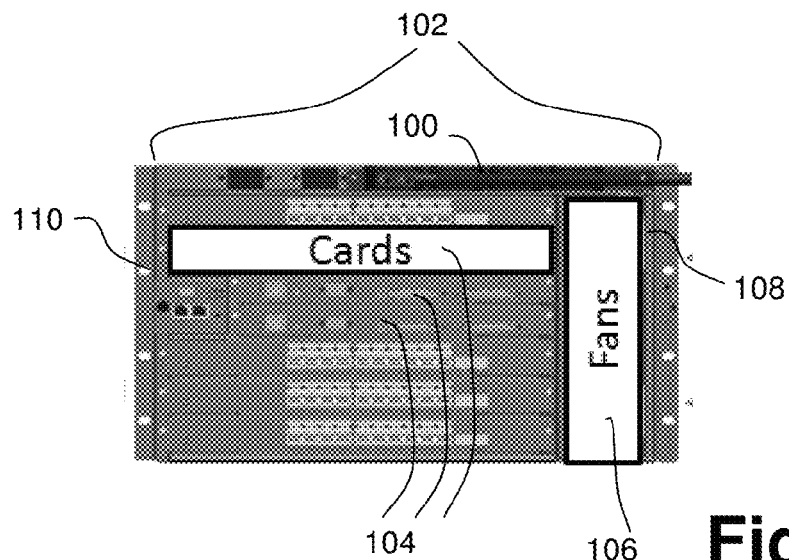
FIG. 1 illustrates an exemplary rack mounted card cage assembly according to the prior art having cooling air ported into one side and exiting from the other side of the rack.
Figure 2:
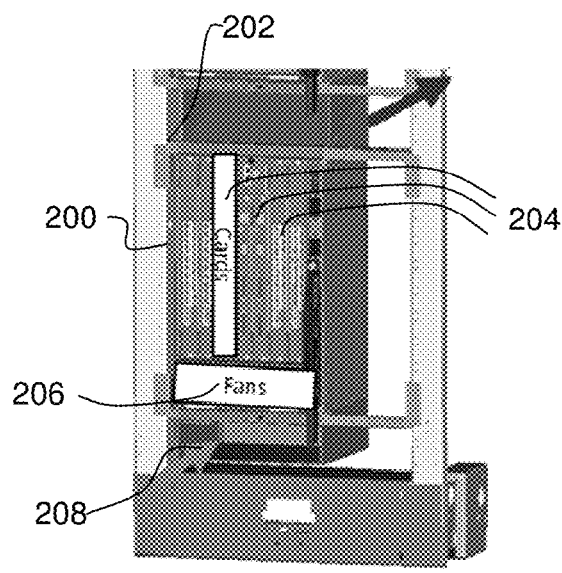
FIG. 2 illustrates an exemplary rack mounted card cage assembly according to the prior art having cooling air ported into the bottom and exiting from the top side of the card cage assembly.
Figure 3A:
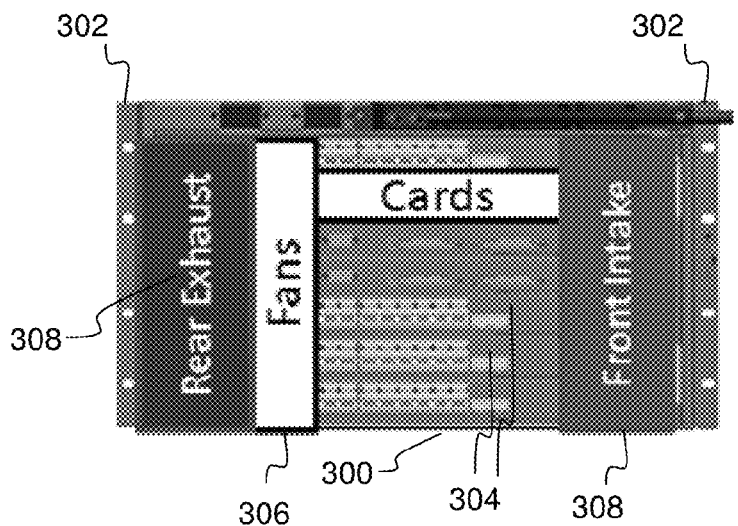
FIGS. 3A and 3B illustrates an exemplary rack mounted card cage assembly according to the prior art having cooling air ported into the front, passing across the assembly and exiting from the back side of the card cage assembly.
Figure 3B:
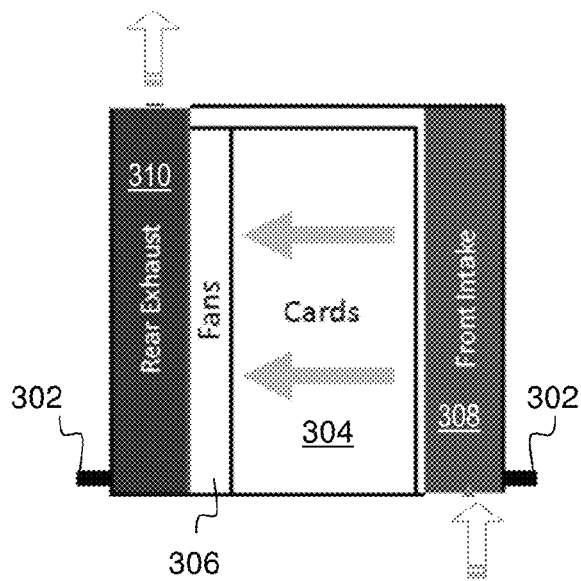
Figure 4:
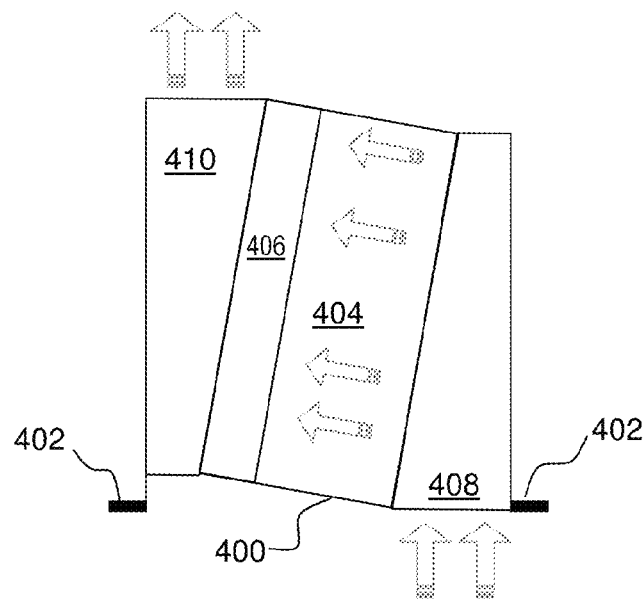
FIG. 4 illustrates a plan view of an exemplary rack mounted card cage assembly according to an embodiment of the invention having cooling air ported into the front and exiting from the back side of the card cage assembly.

Referring now to FIG. 4 there may be seen a plan view of an exemplary rack mounted card cage assembly according to an embodiment of the invention having cooling air ported into the front and exiting from the back side of the card cage assembly. Card cage assembly 400, fans 406, and associated baffles 408 and 410 have flanges 402 for attachment to an equipment rack. Card cage assembly 400 and fans 402 are oriented on a non-orthogonal yaw angle with respect to the front of the equipment rack as established by flanges 402. With the card cage 400 and fan assembly 406 angled as shown, the intake opening into baffle 408 and exhaust opening at baffle 410 in the chassis obtain less impedance to air flow due to the wedge-shape openings. The cooling air is turned less, thereby minimizing the pressure head loss as cooling air traverses the assembly. Less pressure head loss results in greater cooling effectiveness.

Thermal simulations have shown that with horizontal cards mounted in a card cage assembly angled by 8° relative to the chassis side walls, the result obtained would be a 28% air flow-rate increase, relative to a non-angled card cage and a worst case fan operating back-pressure reduction of 10%. Subsequent thermal testing on prototype units has confirmed the results indicated by the thermal simulation. The present invention contemplates that the yaw angle at which the card cage assembly is displaced back from the front face established by the rack is between 1° and 25°, with values of 5° to approximately 10° being appropriate and advantageous for most applications.

Figure 5:
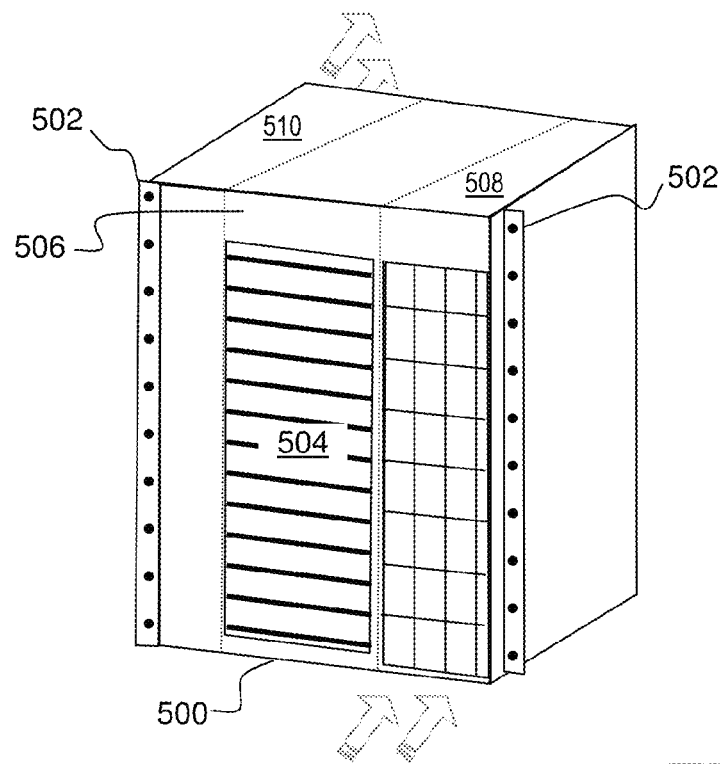
FIG. 5 illustrates an isometric elevation view of the exemplary rack mounted card cage assembly of FIG. 4.

Referring now to FIG. 5, there may be seen an isometric elevation view of the exemplary rack mounted card cage assembly of FIG. 4. Card cage assembly 500, intake duct 508, and output duct 510 have mounting flanges 502 for anchoring the assembly to a rack (not shown). Cooling air flows in intake duct 508, traverses the horizontally mounted cards 504 in card cage assembly 500, pass through fans 506 (behind panel) and exit through exhaust duct 510. Note that the circuit board cards mounted in card cage assembly 500 are mounted in the horizontal position. This horizontal orientation, as opposed to the more normal vertical orientation, is a requisite part of the cooling assembly in order to allow the cooling air to traverse the assembly. Vertically mounted circuit boards would block the cooling air flow from passing from the intake side to the exhaust side.

Figure 6:
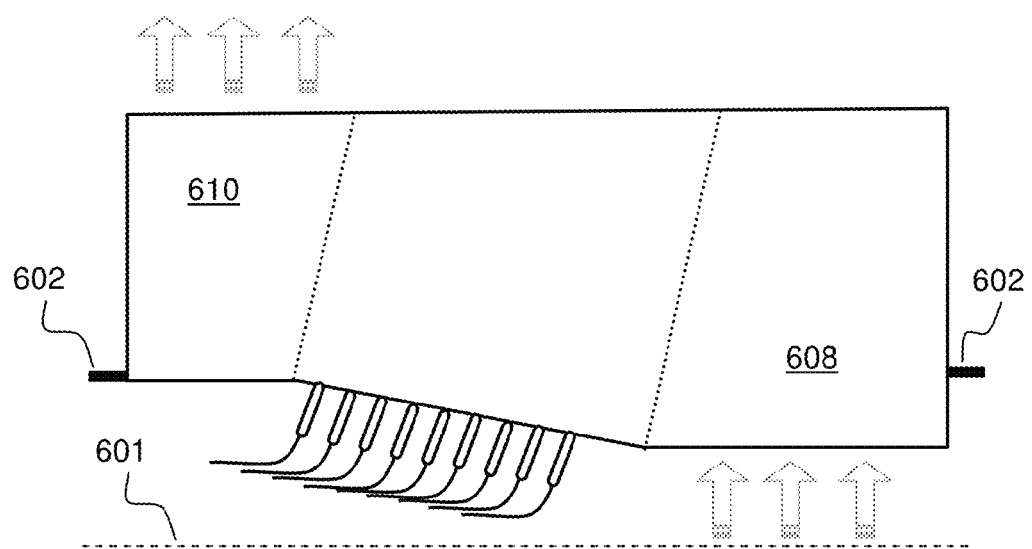
FIG. 6 illustrates a plan view of an exemplary rack mounted card cage assembly according to an embodiment of the invention illustrating the bend radius of cables connected to the front of the assembly.

Referring now to FIG. 6, there is shown a plan view of an exemplary rack mounted card cage assembly according to an embodiment of the invention. Mounting flanges 602, intake plenum 608 and exhaust plenum 610 are all indicated. As well, reference line 601 highlights a further advantage of embodiments of the invention with respect to the bend radius of cables connecting to circuit cards mounted in the card cage assembly. As a portion of the front of the card cage assembly is oriented back from the plane of the rack, a greater bending radius area is established for the cables connecting to the circuit cards. This greater bend radius may be effected without as much obtrusion into the equipment corridor in front of the racks, an advantage both to working in the proximity of the equipment and an advantage with respect to improving the mechanical reliability of optical and electrical cabling at the connectors.

Accordingly what has been disclosed is a method and apparatus for enhancing the flow of cooling air through an electronics assembly.

Numerous modifications, variations and adaptations may be made to the embodiment of the invention described above without departing from the scope of the invention, which is defined in the claims.

What is claimed is:

1. An electronics enclosure for mounting on an equipment rack having a front and back orientation in use, the electronics enclosure comprising:
    a first front face oriented in the direction of the front of said equipment rack, said first front face including at least one air inlet;
    a second back face oriented in the direction of the back of said equipment rack, said second back face including at least one air exhaust;
    a card cage having a plurality of horizontal card slots vertically offset from one another for receiving a plurality of electric cards, wherein each of the plurality of card slots have respective longitudinal axes that are substantially parallel;
    said card cage oriented at a non-orthogonal yaw angle with respect to said first front face;
    a first plenum disposed operatively between said air inlet and the card cage;
    said first plenum having a cross-section which becomes smaller as the distance increases from said air inlet;
    a second plenum disposed operatively between the card cage and said air exhaust, the second plenum having a cross-section which becomes larger as the distance decreases towards said air exhaust; and
    at least one fan operative to force air to flow along an airflow pathway that extends from said air inlet into said first plenum, through said card cage, into said second plenum, and out said air exhaust.

2. An electronics enclosure as claimed in claim 1 wherein the yaw angle is between 1° and 25°.

3. An electronics enclosure as claimed in claim 2 wherein the yaw angle is between approximately 5° and approximately 10°.

4. An electronics enclosure as claimed in claim 3 wherein the yaw angle is approximately 8°.

5. An electronics enclosure as claimed in claim 1 wherein said at least one fan is disposed between said first plenum and said card cage.

6. An electronics enclosure as claimed in claim 1 wherein said at least one fan is disposed between said card cage and said second plenum.

7. An electronics enclosure as claimed in claim 1 wherein said at least one fan is disposed between said first plenum and said card cage; and further comprising at least a second fan disposed between said card cage and said second plenum.

* * * * *